(12) United States Patent
Al-Kadi et al.

(10) Patent No.: US 9,209,477 B2
(45) Date of Patent: Dec. 8, 2015

(54) ENERGY STORAGE CELL FOR A MULTI-CELL ENERGY STORAGE DEVICE

(71) Applicant: Datang NXP Semiconductors Co., Ltd., Jiangsu (CN)

(72) Inventors: Ghiath Al-Kadi, Eindhoven (NL); Matheus Johannus Gerardus Lammers, Nederweert (NL)

(73) Assignee: DATANG NXP SEMICONDUCTORS CO., LTD., Jiangsu (CN)

( * ) Notice: Subject to any disclaimer, the term of this patent is extended or adjusted under 35 U.S.C. 154(b) by 138 days.

(21) Appl. No.: 13/938,898

(22) Filed: Jul. 10, 2013

(65) Prior Publication Data

US 2014/0042957 A1      Feb. 13, 2014

(30) Foreign Application Priority Data

Aug. 8, 2012    (EP) .................................... 12179696

(51) Int. Cl.
*H02J 7/00*    (2006.01)
*H01M 10/04*    (2006.01)
(Continued)

(52) U.S. Cl.
CPC ............ *H01M 10/04* (2013.01); *B60L 3/0046* (2013.01); *B60L 11/1866* (2013.01); *H01M 10/4257* (2013.01); *H01M 10/482* (2013.01); *H01M 10/486* (2013.01); *H02J 7/0054* (2013.01); *B60L 2240/545* (2013.01); *B60L 2240/547* (2013.01); *B60L 2240/549* (2013.01); *G01R 31/3658* (2013.01); *H01M 2010/4271* (2013.01); *H01M 2010/4278* (2013.01); *H01M 2220/20* (2013.01); *H02J 7/0016* (2013.01);
*Y02T 10/7005* (2013.01); *Y02T 10/7055* (2013.01); *Y02T 10/7061* (2013.01)

(58) Field of Classification Search
CPC ............ H01M 10/04; H01M 10/4257; H01M 10/482; H01M 10/486; H01M 10/4271; H01M 2010/4278; H01M 2220/20; H02J 7/0054; H02J 7/0016; B60L 11/1866; B60L 2240/545; B60L 2240/547; B60L 2240/549; B60L 3/0046; G01R 31/3658; Y02T 10/7005; Y02T 10/7055; Y02T 10/7061
USPC ......................................... 320/103, 108, 118
See application file for complete search history.

(56) References Cited

U.S. PATENT DOCUMENTS 6,100,663 A  *  8/2000  Boys et al. .................... 320/108
7,564,217 B2    7/2009  Tanigawa et al.
(Continued)

FOREIGN PATENT DOCUMENTS

CN          1728317       2/2006
CN       202231450 U      5/2012
(Continued)

OTHER PUBLICATIONS

WO2012067261 A1, Nakamura et al. May 24, 2012.*
(Continued)

*Primary Examiner* — Vuthe Siek
(74) *Attorney, Agent, or Firm* — Foley & Lardner, LLP; James F. Ewing; Paul M. H. Pua

(57) ABSTRACT

An energy storage cell for a multi-cell energy storage device is disclosed. The energy storage cell comprises a cell information storage device adapted to store cell information regarding the energy storage cell.

10 Claims, 9 Drawing Sheets

(51) Int. Cl.
  *H01M 10/42* (2006.01)
  *H01M 10/48* (2006.01)
  *B60L 3/00* (2006.01)
  *B60L 11/18* (2006.01)
  *G01R 31/36* (2006.01)

(56) References Cited

U.S. PATENT DOCUMENTS

| | | | |
|---|---|---|---|
| 7,583,053 B2 | 9/2009 | Kamohara | |
| 2010/0090649 A1* | 4/2010 | Sardat et al. | 320/118 |
| 2010/0286938 A1 | 11/2010 | Kaneko | |
| 2012/0057316 A1 | 3/2012 | Kaneshige et al. | |
| 2012/0119705 A1 | 5/2012 | Eberhard et al. | |
| 2012/0206105 A1 | 8/2012 | Nishizawa et al. | |
| 2013/0106429 A1 | 5/2013 | Krause | |
| 2013/0234721 A1* | 9/2013 | Nakamura et al. | 324/434 |

FOREIGN PATENT DOCUMENTS

| | | |
|---|---|---|
| EP | 2 385 604 A1 | 11/2011 |
| JP | 2003077525 | 3/2003 |
| JP | 2012-124141 A | 6/2012 |
| JP | 2012-129183 A | 7/2012 |
| WO | 2011/052594 A1 | 5/2011 |
| WO | 2012/067261 A1 | 5/2012 |
| WO | 2012/070632 A1 | 5/2012 |
| WO | WO-2012/070632 | 5/2012 |

OTHER PUBLICATIONS

Extended European Search Report for EP Patent Appln. No. 12179696.5 (Mar. 4, 2013)xx.

* cited by examiner

ENERGY STORAGE CELL FOR A MULTI-CELL ENERGY STORAGE DEVICE

CROSS-REFERENCE TO RELATED APPLICATIONS

This application claims the priority under 35 U.S.C. §119 of European patent application no. 12179696.5, filed on Aug. 8, 2012, the contents of which are incorporated by reference herein.

This invention relates to energy storage cells for a multiple-cell energy storage device. The energy storage cells can be battery cells or capacitor (super capacitor) cells. One example of particular interest is the energy storage cells used in electric vehicle battery packs.

In (hybrid) electric vehicles, large numbers of series-connected batteries are used to generate a high voltage to drive the motor. For optimum life time of the battery cells (and drive range of the car), the State of Charge (SoC) of all battery cells should always be the same. When the cells in a series-connected string are charged, they all receive the same current, so in principle they should be at the same SoC after charging. There are, however, always mismatches between battery cells, e.g. leakage current and efficiency of converting current into chemically stored energy. Therefore the SoCs of the battery cells will not be the same after charging. If nothing is done, the differences will grow with each charge/discharge cycle.

To keep the SoC of all battery cells as equal as possible cell-balancing circuits are usually added to the high-voltage battery pack of (hybrid) electric cars.

FIG. 1 shows a simplified block diagram of a battery pack with components as defined below:

- the "cell" 10 or "battery cell" 10 is the basic energy storage component (i.e. a single energy storage unit that cannot be sub-divided into smaller energy storage units). The voltage is typically 2.5-4.2V, dependent on chemistry and SoC;
- a "section" 12 is a group of cells 10 that share a number of electronic cell-balancing components. Two sections 12a, 12b are shown—only section 12b shows the constituent cells 10. The voltage is typically 5-17V, depending on the number of cells 10 in the section 12, the cell chemistry and SoC;
- a "module" 14 is a group of sections 12. Two modules 14a, 14b are shown—only module 14b shows the constituent sections 12a, 12b. The voltage is usually chosen to be a "safe voltage", i.e. up to 60V;
- a "slice" 16 is a group of series-connected modules that generate the same voltage as the total battery pack. Two slices 16a,16b are shown—only slice 16a shows the constituent modules 14a,14b. The voltage depends on the application somewhere in the range of 100V to 600V.

A "pack" or "battery pack" 18 is a group of parallel-connected slices 16 that make up the total battery as used in the application. The parallel connection increases the energy content and power capabilities of the battery pack, but not its voltage. In many applications the battery pack 18 consists of just one single slice 16. Depending on the application, the voltage is somewhere in the range of 100V to 600V (same as the slice voltage).

In a cell balancing approach, a cell 10 with the highest charge can be simply (partly) discharged by switching a resistor across it. As this is not energy-efficient this approach is mainly used in hybrid electric vehicles, as the engine can supply enough energy to the battery pack to keep the driving range at an acceptable level. Alternatively, the cell charge can be recycled between cells to maintain balance.

To perform cell balancing, the SoC needs to be determined.

FIG. 2 shows a known multi-cell supervisor 20. The multi-cell supervisor operates as a slave device to the pack controller and performs the following tasks:

- Accurate measurement of cell voltages and temperatures are required by the pack controller for state of charge (SoC), state of health (SoH) and state of function (SoF) determination.
- Safe guarding the over- and under-voltage limits of all cells. If thresholds are exceeded, a hardware fault signal is generated and appropriate action is taken (such as switching-off the pack current, for example)
- Balancing is done to equalize the cell charges and to compensate for leakage differences between cells.

In general, the cell supervisor 20 measures the cell voltages and passes these to a pack controller. The pack controller processes the received measured data and performs the administration/management functions based on the received data. For example, the pack controller commands a cell supervisor 20 to balance the cells according the state of charge of each cell 10.

Cell characterization (e.g. cell SoC, SoH and SoF determination) and checking is a continuous process that monitors each cell's life cycle. When the user needs to replace a broken cell, the user also needs to add information about the new cell into the pack controller administration look-up-table. Also, if the user performs service on the battery pack, the order of the cell placement within the pack may change. This implies also that the respective cell information must also change accordingly, otherwise the user would need to replace the complete pack (which is uneconomical and environmentally unfriendly).

According to the invention, there is provided an energy storage cell according to the independent claim.

It is proposed to store cell information locally at an energy storage cell. In other words, information regarding a parameter of the cell which may be useful for cell administration is maintained in an information store of the cell. Thus, for a multi-cell energy storage device (such as a battery) comprising a plurality of energy storage cells, each energy storage cell may be provided with its own cell information storage device.

The cell information storage device may be an integrated circuit which is adapted to store information relating to at least one of: cell voltage, a temperature of the energy storage cell; a SoC of an energy storage cell; a SoH of an energy storage cell; and a SoF of an energy storage cell. The cell information storage device may also be adapted to communicate stored cell information to a conventional multi-cell energy storage device controller using the existing communication interface of the controller. No modification or additional circuitry may therefore be required for embodiments to be employed with a conventional multi-cell energy storage device controller.

Embodiments enable the storage of cell information such as cell voltages and temperatures for indicating a SoC, SoH and SOF an energy storage cell and/or a multi-cell energy storage device.

Communication with the cell information store of a cell may be performed via a dedicated 2-way load pulse modulation method. This may be done without adding any new communication interface to a conventional controller.

By storing cell information locally at an energy storage cell, cell maintenance on a multi-cell energy storage device (such as a high voltage battery pack) may be undertaken without needing to replace and entire pack of cells. This may extend the life of the multi-cell energy storage device.

The cell information storage device may be physically mounted to the energy storage cell and electrically connected to the cell.

Embodiments may be used in a multi-cell energy storage device. A multi-cell energy storage device may therefore comprise a plurality of energy storage cells according to an embodiment. Such a multi-cell energy storage device may further comprise a controller adapted to: identify an energy storage cell or cells from which charge is to be removed; and transfer energy from the identified cell or cells to another cell or cells.

Also, embodiments may be used in an electric vehicle battery cell pack. An electric vehicle may therefore comprise an electric vehicle battery pack comprising one or more multi-cell energy storage devices having an energy storage cells according to an embodiment.

Examples of the invention will now be described in detail with reference to the accompanying drawings, in which.

Figure 1:
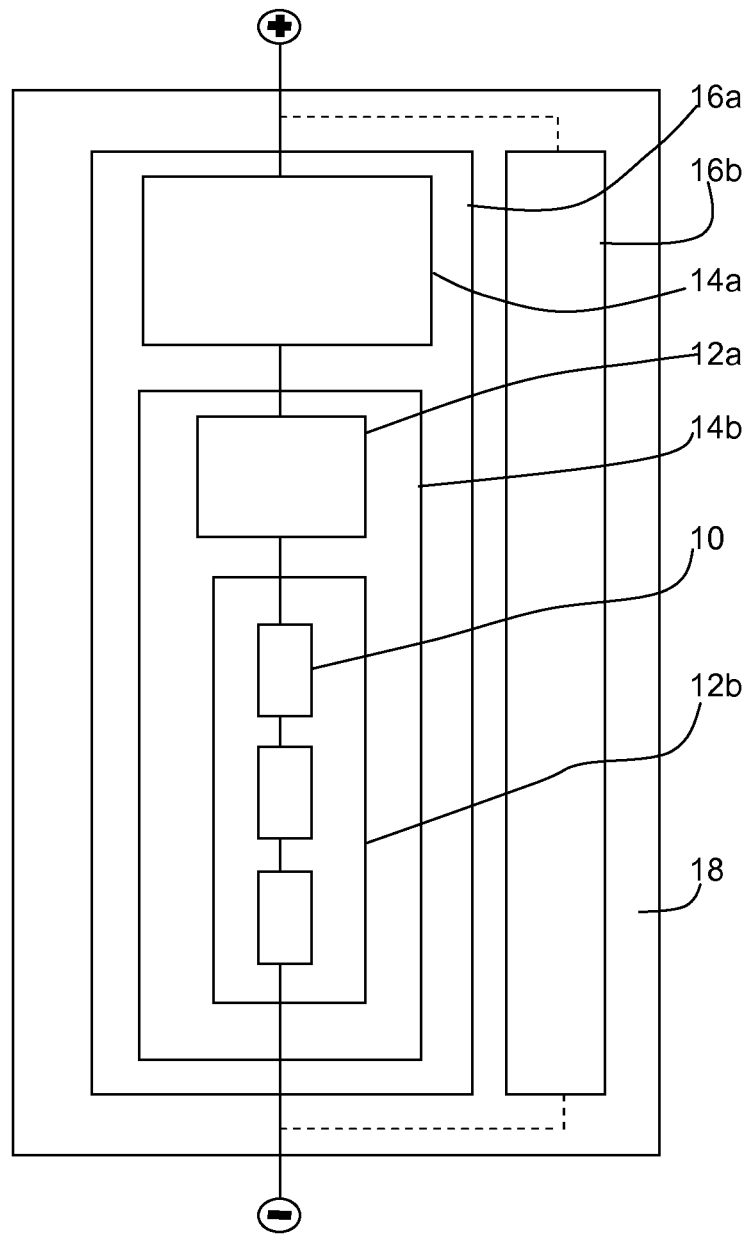
FIG. 1 shows a simplified block diagram of a conventional battery pack to show the different components.
Figure 2:
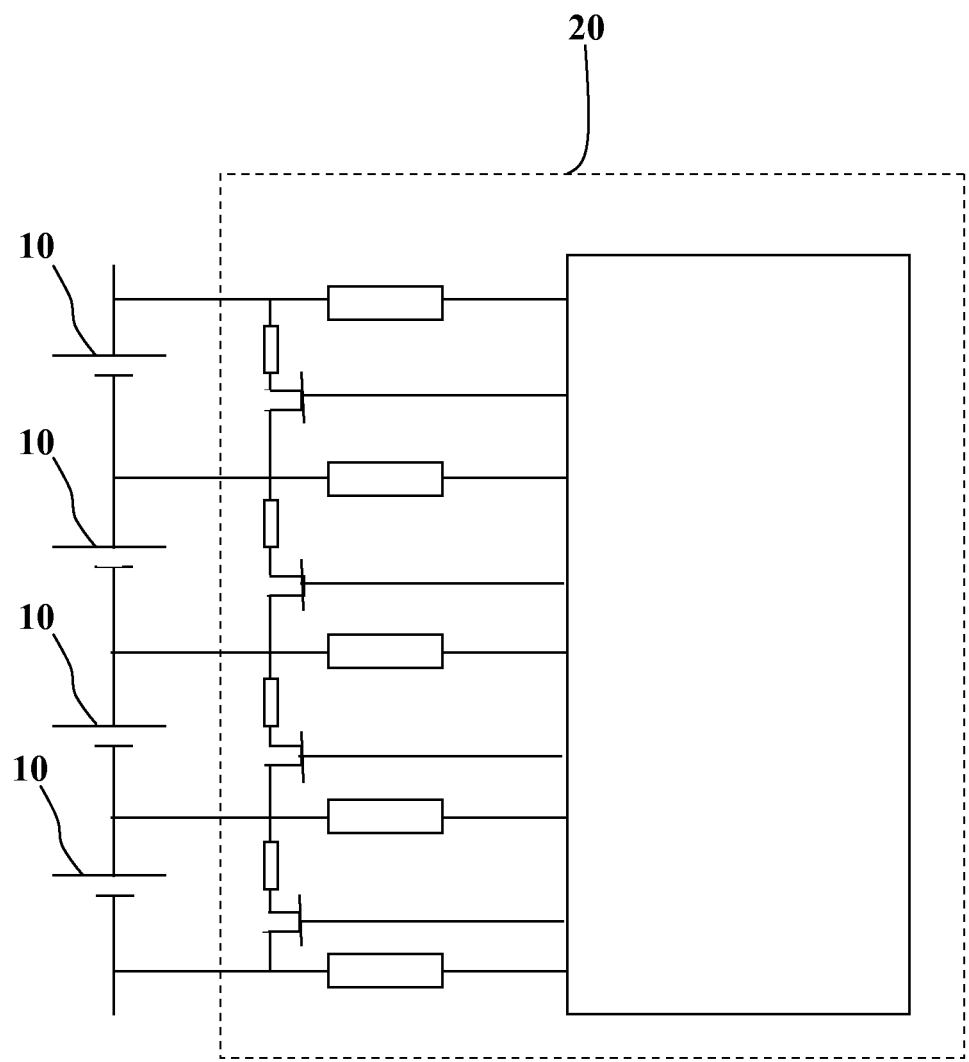
FIG. 2 shows a simplified block diagram of a conventional multi-cell supervisor connected to a plurality of energy storage cells (arranged in series)
Figure 3:
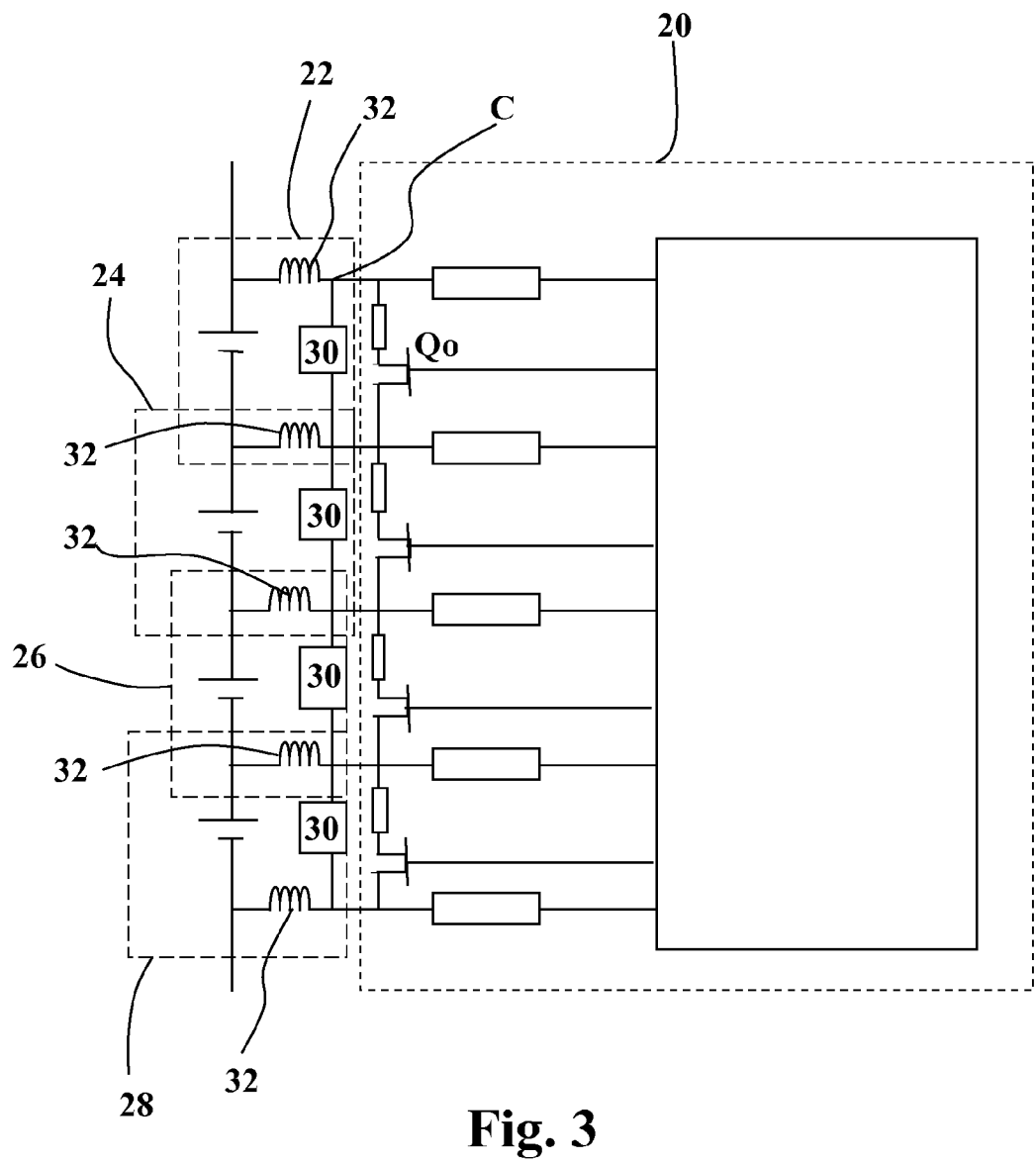
FIG. 3 shows a simplified block diagram of a conventional multi-cell supervisor connected to a plurality of energy storage cells according to an embodiment of the invention.
Figure 7:
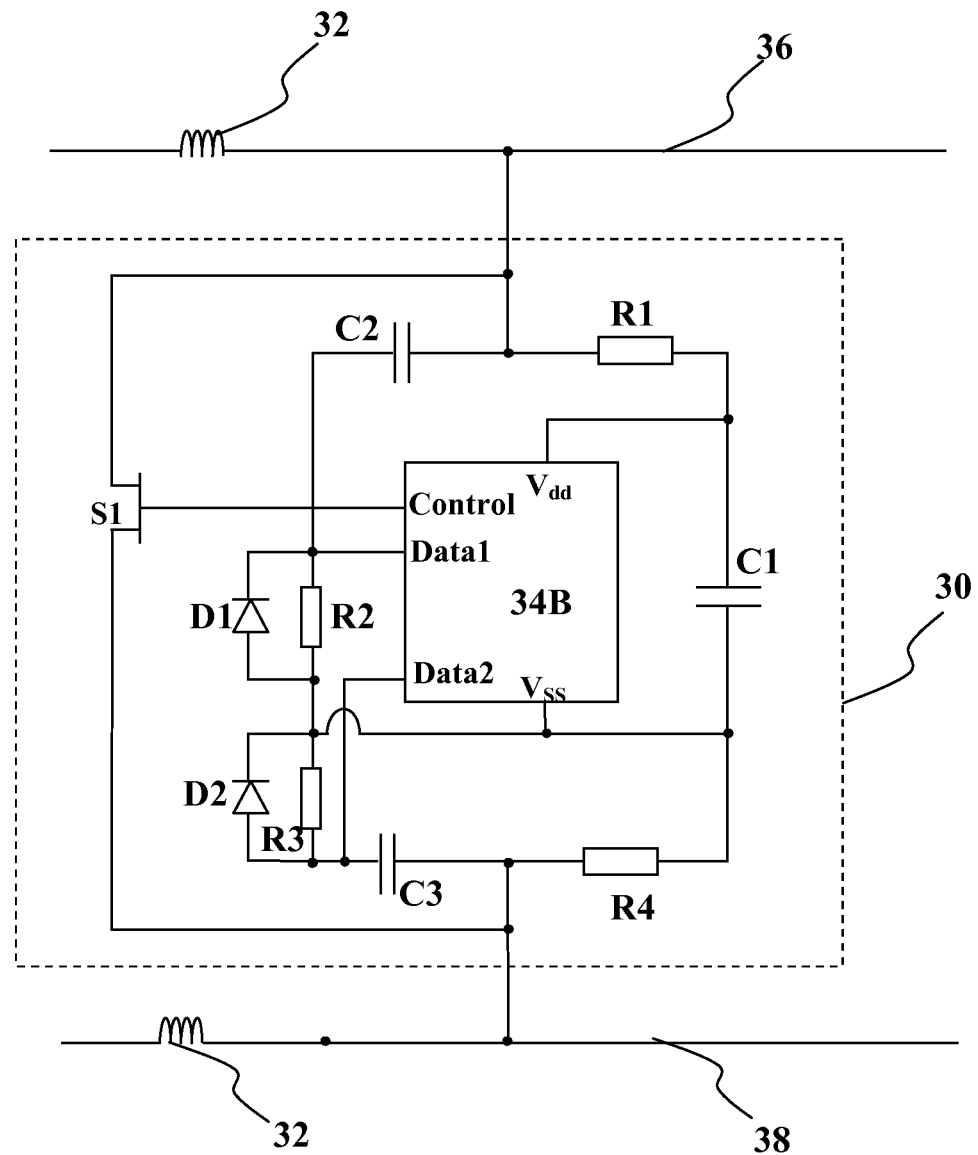
Figure 8A:
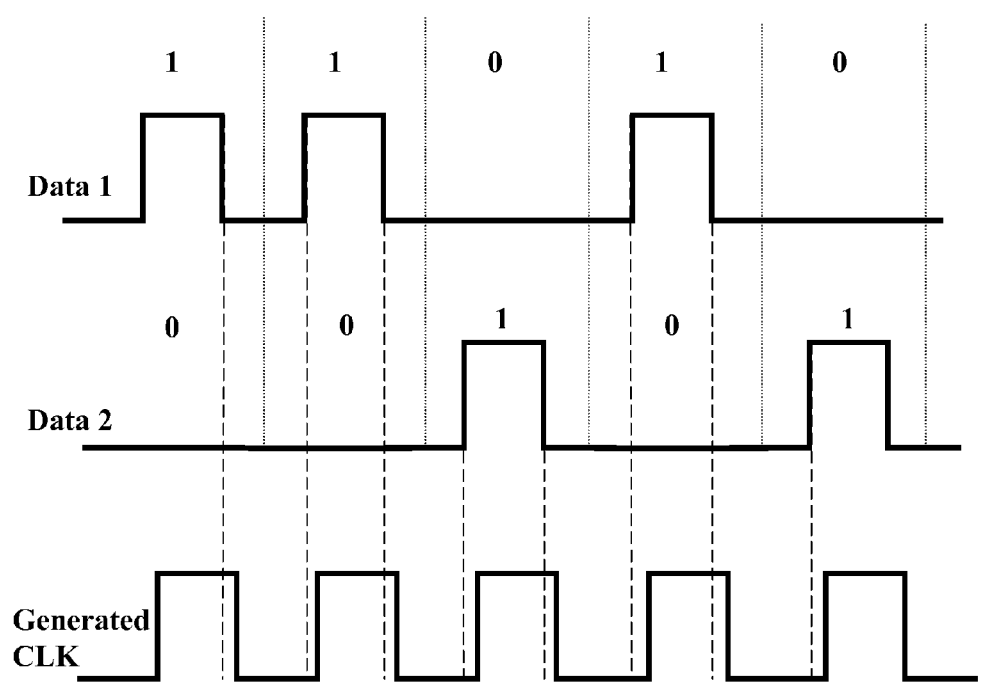
Figure 8B:
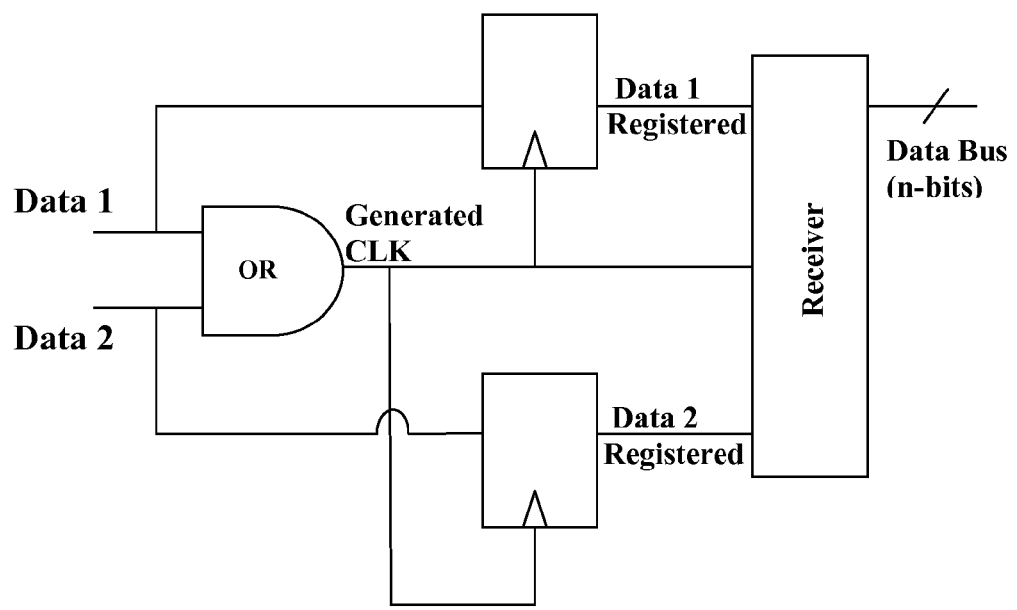

FIG. 7 is a simplified circuit diagram of a cell information storage circuit of the embodiment of FIG. 3, wherein the cell information storage circuit is arranged to permit bi-directional communication between the supervisor and the cell information storage circuit, and wherein the cell information storage circuit uses synchronous event driven communication by regenerating the system clock from the two data inputs (as shown in FIGS. 8A and 8B).

FIG. 8A illustrate exemplary voltage waveforms for the Data1, Data2 and generated CLK signals applied in the cell information storage circuit of FIG. 7; and FIG. 8B shows a simplified block diagram of a circuit for generating the clock signal of the embodiment of FIG. 7.

Referring to FIG. 3, there is shown a conventional multi-cell supervisor 20 connected to first 22 to fourth 28 energy storage cells according to an embodiment of the invention. Here, reference to an energy storage cell is to be taken to mean a cell as described in the background section above. In other words, reference to an energy storage cell should be taken to mean the basic energy storage component (i.e. a single energy storage unit that cannot be sub-divided into smaller energy storage units) of a multi-cell energy storage device.

The first 22 to fourth 28 energy storage cells are connected in series, and each energy storage cell comprises a cell information storage circuit 30 mounted to its housing and connected to the energy storage cell via inductive elements 32.

Here, each cell information storage circuit 30 is an integrated circuit which is adapted to store information relating to the energy storage cell it is connected to. Such information includes the cell voltage, a temperature of the energy storage cell, a SoC of the energy storage cell, a SoH of the energy storage cell, and a SoF of the energy storage cell.

Each energy storage cell therefore comprises an information store which is adapted to store information regarding a parameter of the cell which may be useful for cell administration.

A cell information storage circuit 30 is also adapted to communicate stored cell information to a conventional multi-cell energy storage device controller using the existing communication interface of the controller. The inductive elements 32 are arranged to decouple a cell information storage circuit 30 from it associated energy storage cell during the communication process, otherwise the energy storage cell may cause a short circuit (due to low impedance of the cell) that prevents communication.

Figure 4A:
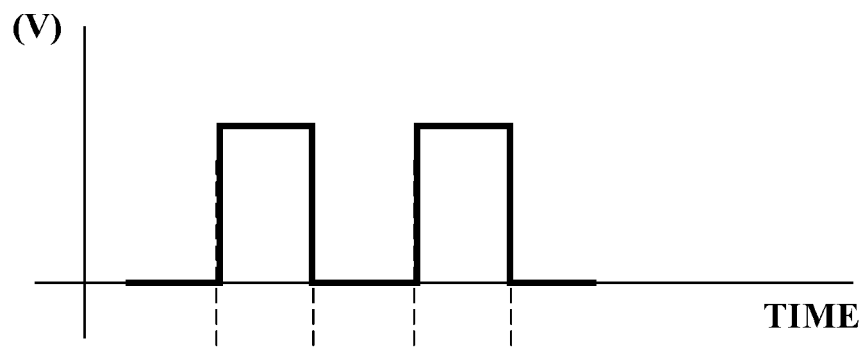
FIG. 4A illustrates a voltage waveform against time for the gate of a transistor of the cell supervisor of FIG. 3.
Figure 4B:
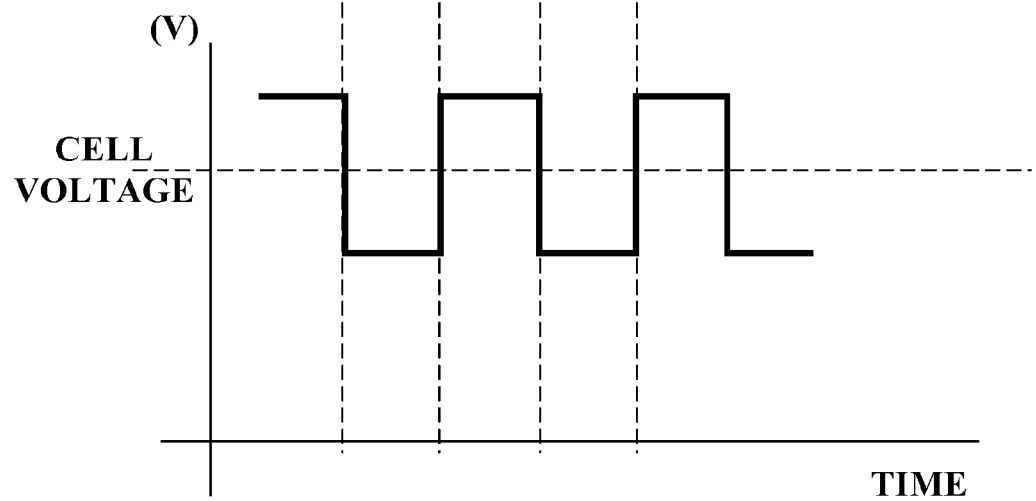
FIG. 4B illustrates a voltage waveform for the voltage measured at point C of FIG. 3.

FIG. 4A illustrates a voltage waveform against time for the gate of a transistor Qo of the cell supervisor 20 of FIG. 3 and FIG. 4B illustrates a voltage waveform for the voltage measured at point C of FIG. 3.

The average voltage across an inductive coil 32 is zero and hence the average supply voltage of the cell information storage circuit 30 of the first energy storage cell 22 (i.e. the voltage a point C as shown in FIG. 4B) is equal to the cell voltage of the first energy storage cell 22. Here, it is noted that the communication pulses driving the transistor Qo are injected on top the cell information storage circuit 30 supply voltage.

The communication pulses do not interfere with the normal balancing operation of the transistor Qo because switching frequency is high (MHz) with respect to the balancing frequency (mHz), the inductive coil 32 impedance is high during communication with the controller 20. Therefore, during communication when the inductive coil impedance 32 is high, no substantial charge is removed from the energy storage cell 22.

Figure 5:
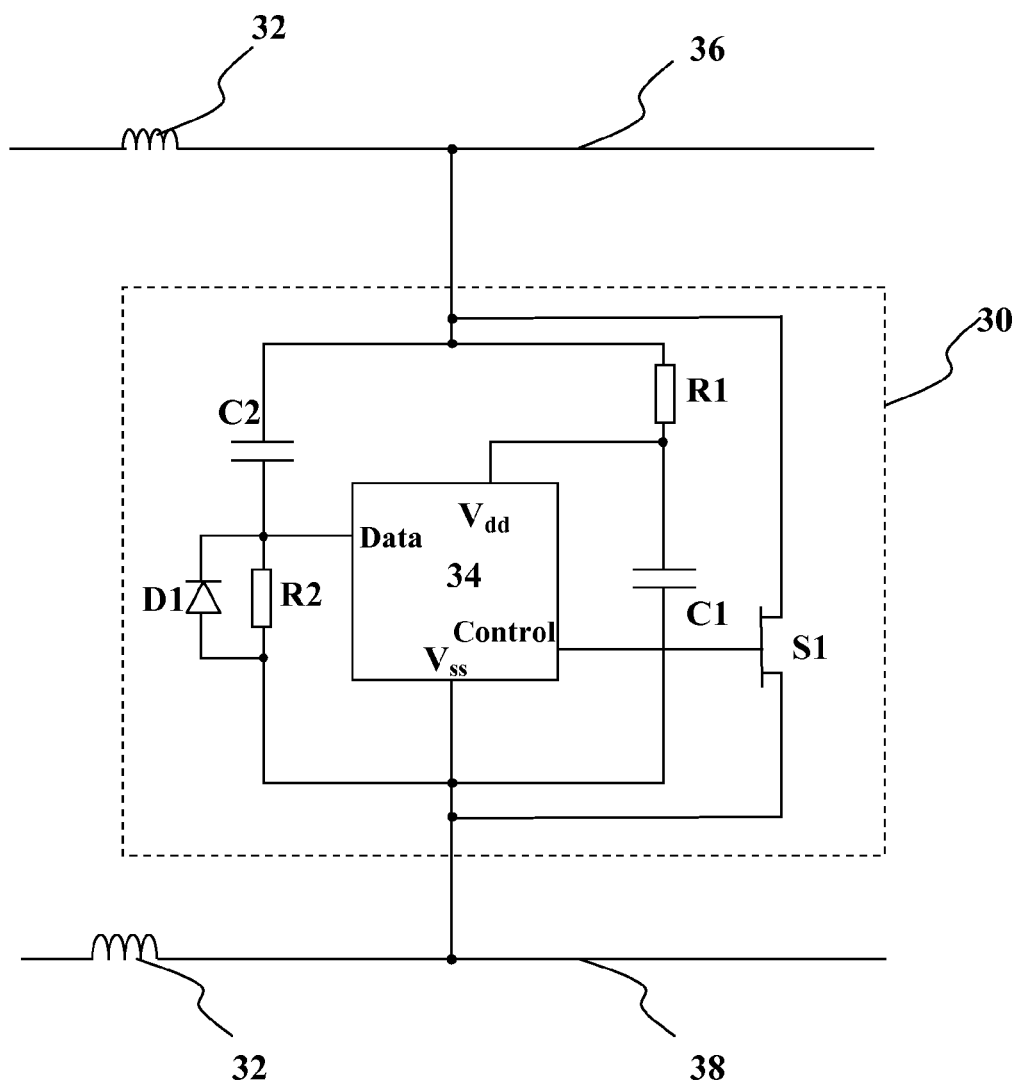
FIG. 5 is a simplified circuit diagram of a cell information storage circuit of the embodiment of FIG. 3, wherein the cell information storage circuit is arranged to permit bi-directional communication between the supervisor and the cell information storage circuit, and wherein the cell information storage circuit uses asynchronous event driven communication.

FIG. 5 shows the cell information storage circuit 30 of the first energy storage cell 22 in more detail. As explained above in conjunction with FIG. 3, the cell information storage circuit 30 is connected to the first energy storage cell 22 via inductive coils 32, and is connected between two I/O connections of the controller 20.

The cell information storage circuit 30 comprises an integrated circuit core 34 having its positive voltage supply Vdd connected to the first I/O connection 36 via a first resistor R1, and its negative voltage supply Vss connected to the second I/O connection 38. Between the positive voltage supply Vdd and the negative voltage supply Vss of the IC core 34 there is connected a first capacitor C1. The first resistor R1 and the first capacitor C1 form a Low Pass Filter (LPF) that removes the communication pulses whilst providing the supply voltage to the IC core 34.

A second capacitor C2 is connected between the data input (Data) of the IC core 34, and a second resistor R2 is connected between the data input (Data) of the IC core 34 and the second I/O connection 38. A clamp diode D1 is also connected in parallel with the second resistor R2. The second resistor R2 and the second capacitor C2 form a High Pass Filter (HPF) that retrieves the communication pulses with respect to the negative voltage supply Vss connection by using the clamp diode D1.

A transistor switch S1 is connected between the first I/O connection 36 and the second I/O connection 38, and the control terminal (e.g. the gate for a MOSFET switch) is connected to the 'Control' output terminal of the integrated circuit core 34.

Figure 6:
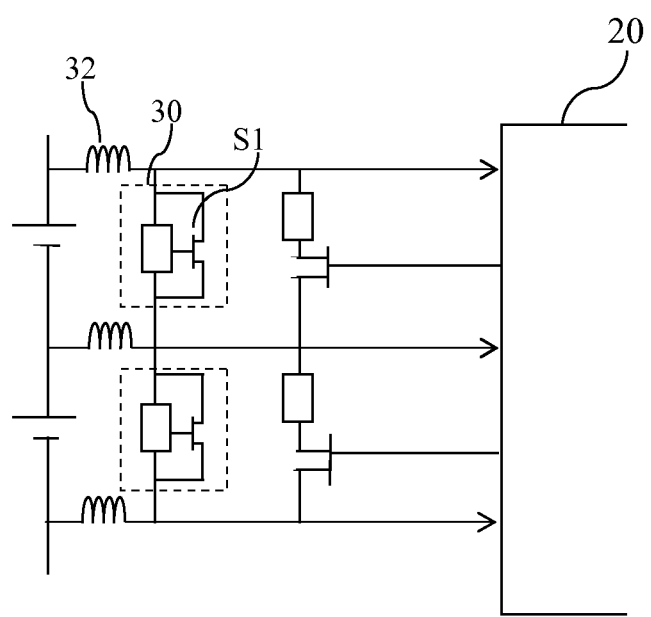
FIG. 6 shows a simplified block diagram of a conventional multi-cell supervisor connected to a plurality of energy storage cells according to an embodiment of the invention.

Turning to FIG. 6, communication from the cell information storage circuit 30 to the cell supervisor 20 is illustrated. This is done by using the Kelvin connections to the cell supervisor 20. The cell information storage circuit 30 uses a load modulation technique by switching the voltage over the transistor switch S1 (shown in FIGS. 5 and 6). During communication, the inductive coil impedances 32 are significantly high, such that there is no substantial charge removed from the energy storage cell 22. The high impedance of these coils 32 allows bi-directional communication between the cell information storage circuit 30 and the cell supervisor 20.

Thus, the circuit arrangement of FIG. 5 enables communication between the supervisor 20 and the IC core 34.

FIG. 7 shows an extension of circuit illustrated in FIG. 5, wherein the circuit comprises the addition of symmetric inputs from both sides. Here, the IC core 34B has first (Data1) and second (Data2) data inputs, and is arranged in a similar manner to that of FIG. 5. Thus, the first data input (Data1) is connected in the same manner as the data input (Data) of the IC core 34 of FIG. 5. Further, a third resistor R3 and second clamp diode D2 are connected in parallel between the second resistor R2 and the second data input (Data2) of the IC core 34. A third capacitor C3 is connected between the second data input (Data2) of the IC core 34, and a fourth resistor R4 is connected between the first capacitor C1 and the second I/O connection 38.

The IC core 34B comprises two data inputs Data1 and Data 2 for clock signal CLK generation and data retrievals. Both the first (Data1) and second (Data2) data inputs receives different values, e.g. Data1 expects to receive the ones and Data2 receives the zeros of the pulse sequences as shown in FIGS. 8A and 8B.

FIGS. 8A and 8B illustrate the clock signal CLK generation and data extraction, wherein the cell information storage circuit 30 uses synchronous event driven communication by regenerating the system clock signal CLK from the two data inputs Data1 and Data2. Specifically, the clock signal CLK is regenerated by or-ing both data inputs as shown in FIG. 8B.

It will be understood that embodiment enable the storage of cell information such as cell voltages and temperatures for SoC, SoH and SOF in/at/on the energy storage cell itself. Communication between the cell information storage device (such as an IC, for example) may be performed using a dedicated 2-way load pulse modulation technique. In this way, the existing I/O interface of a conventional controller can be employed without requiring any modification.

Embodiments may comprise a cell information storage device linked to each energy storage cell of a multi-cell energy storage device such as a battery pack. Accordingly, embodiments may be used in High Voltage (HV) battery packs (commonly used in the automotive field or electric vehicle), and may permit battery pack maintenance such that the need for replacing the complete battery pack is avoided. This can extend the life cycle of such a HV battery pack. A hybrid or electric vehicle may therefore comprise a battery pack comprising a multi-cell energy storage device which has energy storage cells according to an embodiment.

The techniques described in this document can also be applied to super capacitors instead of battery cells.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An energy storage cell for a multi-cell energy storage device, the energy storage cell comprising a cell information storage device adapted to store cell information regarding the energy storage cell, wherein the cell information storage device comprises an integrated circuit connected in parallel with the energy storage cell, wherein the integrated circuit comprises:
   an integrated circuit core comprising positive and negative voltage supply input terminals, a data input terminal, and a control output terminal;
   a low pass filter connected between the positive and negative voltage supply input terminals;
   a high pass filter connected between the data input terminal and the negative voltage supply input terminal; and
   a switch connected between the positive and negative voltage supply input terminals,
   wherein the control output terminal of the integrated circuit core is connected to the control terminal of the switch core so as to control operation of the switch.

2. The energy storage cell of claim 1, wherein the integrated circuit comprises:
   an integrated circuit core comprising positive and negative voltage supply input terminals, first and second data input terminals, and a control output terminal;
   a low pass filter connected between the positive and negative voltage supply input terminals;
   a high pass filter connected between the first data input terminal and the negative supply input terminal;
   a low pass filter connected between the second data input terminal and the negative voltage supply input terminal; and
   a switch connected between the positive and negative voltage supply input terminals,
   wherein the control output terminal of the integrated circuit core is connected to the control terminal of the switch core so as to control operation of the switch.

3. The energy storage cell of claim 2, wherein the integrated circuit core is configured to generate a switch control signal for outputting via the control output terminal based on signals present at the first and second data input terminals.

4. The energy storage cell of claim 1, wherein the cell information storage device is inductively decoupled from the energy storage cell.

5. The energy storage cell of claim 1, wherein the cell information comprises information relating to at least one of: cell voltage; a temperature of the energy storage cell; a state of charge of the energy storage cell; a state of health of the energy storage cell; and a state of function of the energy storage cell.

6. A multi-cell energy storage device comprising a plurality of energy storage cells according to claim 1.

7. A multi-cell energy storage device according to claim 6, further comprising a controller configured to:
   identify at least one energy storage cell from which charge is to be removed; and
   transfer energy from the identified at least one cell to another at least one cell.

8. An electric vehicle battery cell pack comprising at least one multi-cell energy storage device as claimed in claim 6.

9. An electric vehicle comprising an electric battery pack comprising at least one multi-cell energy storage device as claimed in claim 6.

10. A hybrid vehicle comprising an electric battery pack comprising at least one multi-cell energy storage device as claimed in claim 6.

* * * * *